US 6,698,937 B2

(12) United States Patent
Grimes et al.

(10) Patent No.: US 6,698,937 B2
(45) Date of Patent: Mar. 2, 2004

(54) OPTICAL CONNECTOR MECHANISM

(75) Inventors: Gary J. Grimes, Hoover, AL (US); Norman R. Lampert, Norcross, GA (US); Charles J. Sherman, Westminster, CO (US)

(73) Assignee: Lucent Technologies Inc., Murray Hill, NJ (US)

( * ) Notice: Subject to any disclaimer, the term of this patent is extended or adjusted under 35 U.S.C. 154(b) by 26 days.

(21) Appl. No.: 09/903,029

(22) Filed: Jul. 11, 2001

(65) Prior Publication Data

US 2003/0012512 A1 Jan. 16, 2003

(51) Int. Cl.[7] ................................................ G02B 6/36
(52) U.S. Cl. .................................... 385/53; 439/157
(58) Field of Search ..................... 385/53, 75, 147; 439/64, 160; 361/752, 801, 802, 732

(56) References Cited

U.S. PATENT DOCUMENTS

| | | | | |
|---|---|---|---|---|
| 4,217,030 A | * | 8/1980 | Howarth ........................ 385/64 |
| 5,205,753 A | * | 4/1993 | Butterfield et al. ........... 439/157 |
| 5,238,423 A | * | 8/1993 | Hillis et al. .................. 439/259 |
| 5,644,470 A | | 7/1997 | Benedict et al. .............. 361/686 |
| 5,657,204 A | | 8/1997 | Hunt ............................ 361/752 |
| RE35,938 E | * | 10/1998 | O'Brien et al. ............... 439/160 |
| 5,848,906 A | * | 12/1998 | Glusker et al. ............... 439/157 |
| 5,904,528 A | * | 5/1999 | Lin et al. ..................... 438/286 |
| 5,967,824 A | * | 10/1999 | Neal et al. .................... 439/342 |
| 6,422,760 B1 | * | 7/2002 | Matasek et al. ............... 385/60 |

FOREIGN PATENT DOCUMENTS

| | | | |
|---|---|---|---|
| EP | 63212908 | 9/1988 | ............ G02B/6/38 |
| EP | 0 335 531 | 10/1999 | ............ G02B/6/38 |
| WO | WO 98 59271 | 12/1998 | ............ G02B/6/38 |

* cited by examiner

*Primary Examiner*—Tulsidas Patel

(57) ABSTRACT

The present invention relates to fiber optics. In this regard, embodiments of the invention may be construed as providing interconnection systems for optical media. An embodiment of the present invention includes an optical circuit pack assembly, an optical circuit board, a child board, an optical device having a front end and a back end, an optical connector, and an optical connector mechanism. As such, the optical device is mounted on the child board and the child board is in turn slidably affixed to the optical circuit board. The optical connector is mounted on the optical circuit pack assembly such that as an operator inserts the optical circuit board into the optical circuit pack assembly, the optical connector and optical device are obscured from view. Operation of the optical connector mechanism causes the child board to move along a longitudinal axis of the child board, thereby causing the optical connector and the optical device to become operably engaged.

21 Claims, 6 Drawing Sheets

OPTICAL CONNECTOR MECHANISM

BACKGROUND OF THE INVENTION

1. Technical Field

The present invention is generally related to fiber optics and, more particularly, to devices, systems, and methods for interconnecting optical components.

2. Description of the Related Art

For a variety of reasons, modern communications equipment continues to be designed for processing data at progressively higher speeds. One reason relates to the desire to transfer video information between computers. Such data transfer has grown exponentially in recent years because of the Internet, and no decrease in growth is anticipated in the foreseeable future. In order to handle this growth, optical circuitry appears capable of meeting the demand because of the enormous bandwidth that an optical fiber can provide. Nevertheless, distribution equipment is still needed to route optical signals to the same locations. Therefore, optical connecting hardware needs to be sufficiently small to accommodate large numbers of individual fiber connections.

Also of concern is communication congestion. One particular location where congestion occurs is on circuit boards that contain optical components (i.e., optical circuit boards) where individual input/output ports are provided to make connections on a per-fiber basis. At present, individual optical connectors are often mounted on the faceplate or front panel of an optical circuit board, or, in the alternative, the optical connectors may be installed in the backplane of an optical circuit pack assembly as a blind-mating single or multifiber array. Various problems exist with either, or both, of these methods. Being restricted to either the front panel or backplane necessarily limits the amount of space available for utilizing optical connectors. As well, the system in which the optical circuit board is being installed may be a midplane design with no backplane cables available, or may not even utilize a backplane. Where a backplane is available, an abundance of other backplane connectors (such as copper connectors or other optical connectors) could make the force necessary to insert the optical circuit board exceed a desirable value, thereby necessitating splitting up the insertion and connection forces.

Thus, there is a need for improved devices, systems, and/or methods that address these and/or other shortcomings of the prior art.

SUMMARY OF THE INVENTION

The present invention relates to fiber optics. In this regard, embodiments of the invention may be construed as providing interconnection systems for optical media. An embodiment of the present invention includes an optical circuit pack assembly, an optical circuit board, a child board, an optical device having a front end and a back end, an optical connector; and an optical connector mechanism. As such, the optical device is mounted on the said child board and the child board is in turn slidably affixed to the optical circuit board. The optical connector is mounted on the optical circuit pack assembly such that as an operator inserts the optical circuit board into the optical circuit pack assembly, the optical connector and optical device are obscured from view. Operation of the optical connector mechanism causes the child board to move along a longitudinal axis of the child board, thereby causing the optical connector and the optical device to become operably engaged.

Some embodiments may be construed as providing methods for installing optical devices in an optical circuit pack assembly. In this regard, a preferred method includes the steps of: mounting an optical connector to an upper or lower fixed panel of an optical circuit pack assembly; mounting an optical device on a substrate; slidably connecting the substrate to an optical circuit board; slidably inserting the optical circuit board into the optical circuit pack assembly; and urging the substrate along a longitudinal axis of the substrate such that the optical connector and the optical device are operably connected.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

Figure 1A:
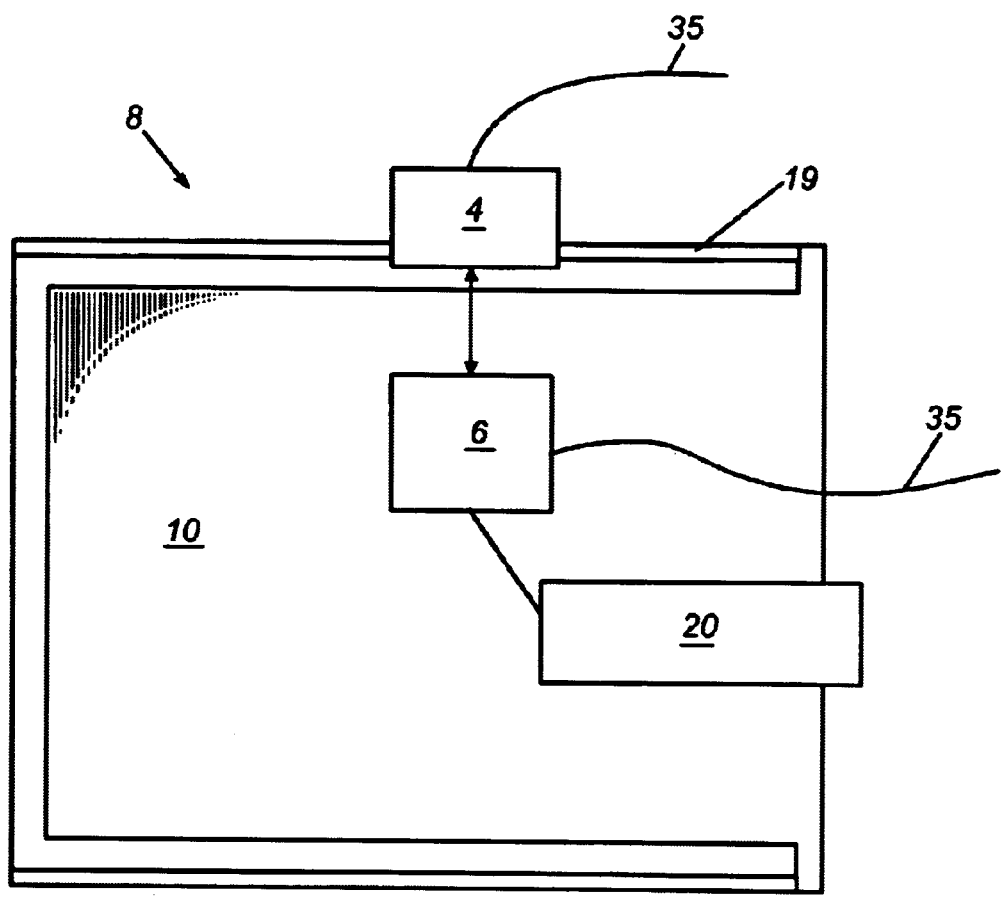
FIG. 1A is a schematic of an optical circuit board depicting a preferred embodiment of the present invention.

Turning now to the drawings, FIG. 1A is a schematic representation of one embodiment of the present invention. As shown, an optical circuit board 10 has been installed in an optical circuit pack assembly 8. The optical circuit pack assembly 8 includes a fixed assembly 4 of optical connectors (not shown) and associated optical fibers 35 attached to the fixed panel 19. Note, another embodiment of the present invention can include electrical vice optical connectors, or a combination of both. The optical circuit board 10 includes a movable assembly 6 supporting optical devices (not shown), associated optical fibers 35, and an optical connector mechanism 20 for moving the movable assembly 6. After installing the optical circuit board 10 in the optical circuit pack assembly 8, the movable assembly 6 is no longer accessible and/or visible, and therefore an operator is unable to directly engage the optical devices with the optical connectors. Note, however, that the optical connector mechanism 20 is connected to the movable assembly 6 and remains accessible after installation of the optical circuit card 10, because, in some embodiments, at least a portion remains outside the optical circuit pack assembly 8. Furthermore, the optical connector mechanism 20 is configured to urge the movable assembly 6 as indicated in FIG. 1A. By so urging the movable assembly 6, the optical fibers 35 may be engaged and disengaged so as to enable selective optical communication of the fibers. Because the operator typically performs this task from outside the optical circuit pack assembly 8, and need not even view the optical device and optical connectors, the task of engaging and/or disengaging is referred to as "blind-mating."

Figure 1B:
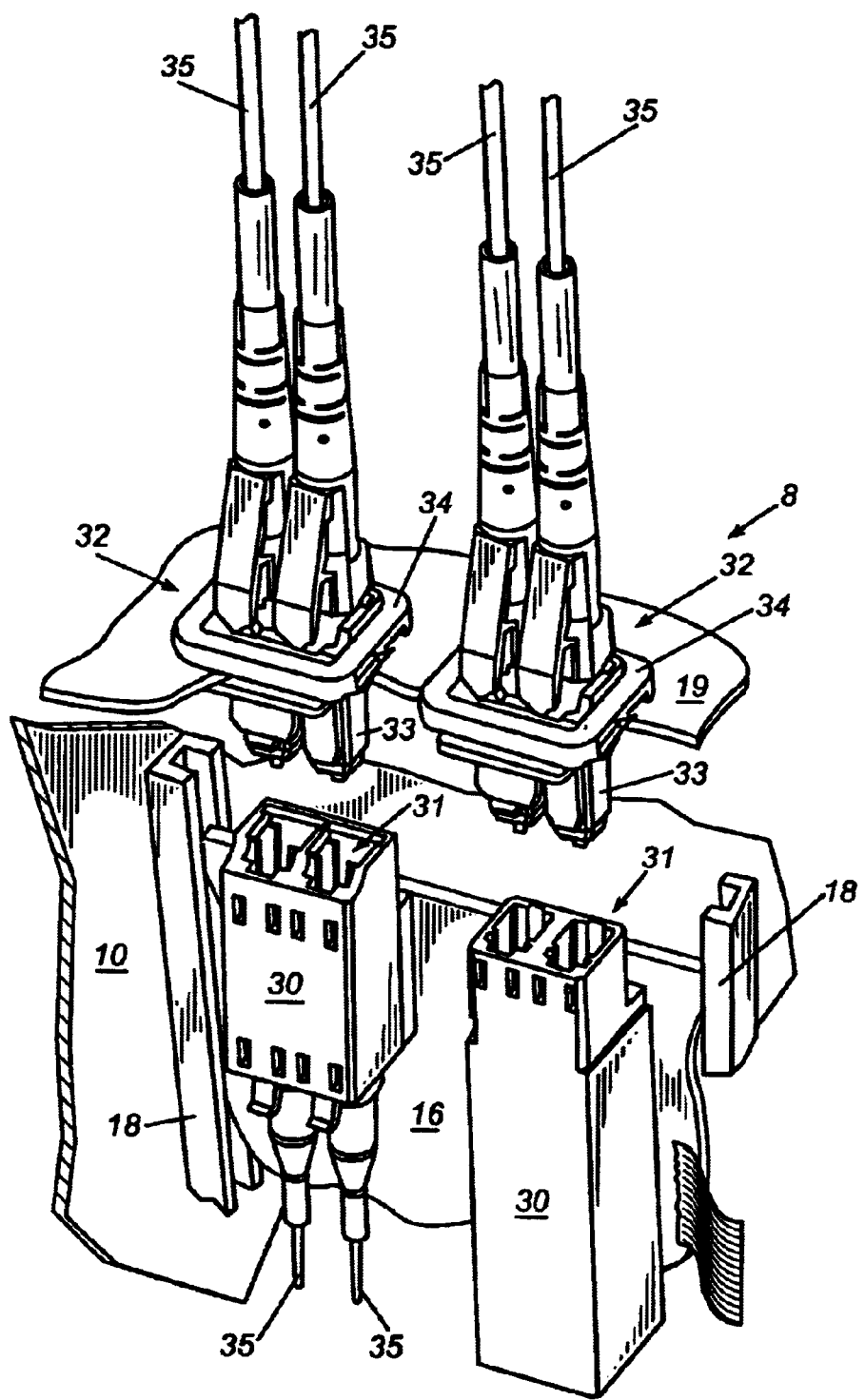
FIG. 1B is a perspective view of optical devices and optical connectors as configured on a cutaway portion of a child board and fixed panel, respectively, in one embodiment of the present invention.

FIG. 1B shows a perspective view of a cutaway portion of an optical circuit board 10 and fixed panel 19, after the optical circuit board 10 has been inserted into the optical circuit pack assembly 8. As depicted in FIG. 1B, the optical devices 30 may be passive adapters for joining and aligning optical plugs 33 or active devices such as transceivers, lasers, detectors, LEDs, etc. The optical devices 30 are about to be connected to an array of optical connectors 32 that are attached to a fixed panel 19, such as an upper or lower panel of a shelf in an optical circuit pack assembly 8. In the embodiment of the present invention revealed in FIG. 1B, the optical devices 30 are first mounted on a substrate, in the instant case a child board 16, which is in turn slidably secured to the optical circuit board 10 by child board card guides 18. In the present invention, all of the optical connectors 32 comprise optical plugs 33, which are inserted into an optical connector joining assembly 34 that attaches to the fixed panels 19. The optical connector joining assemblies 34 are designed to provide the optical plugs 33 with small but limited amount of travel in the plane of the fixed panel 19 so that the optical plugs 33 can accommodate positional variations of the optical devices 30. These positional variations are attributable to, for example, an accumulation of manufacturing tolerances on the optical circuit board 10. The optical plugs 33 interlock with the optical connector joining assembly 34.

Figure 2A:
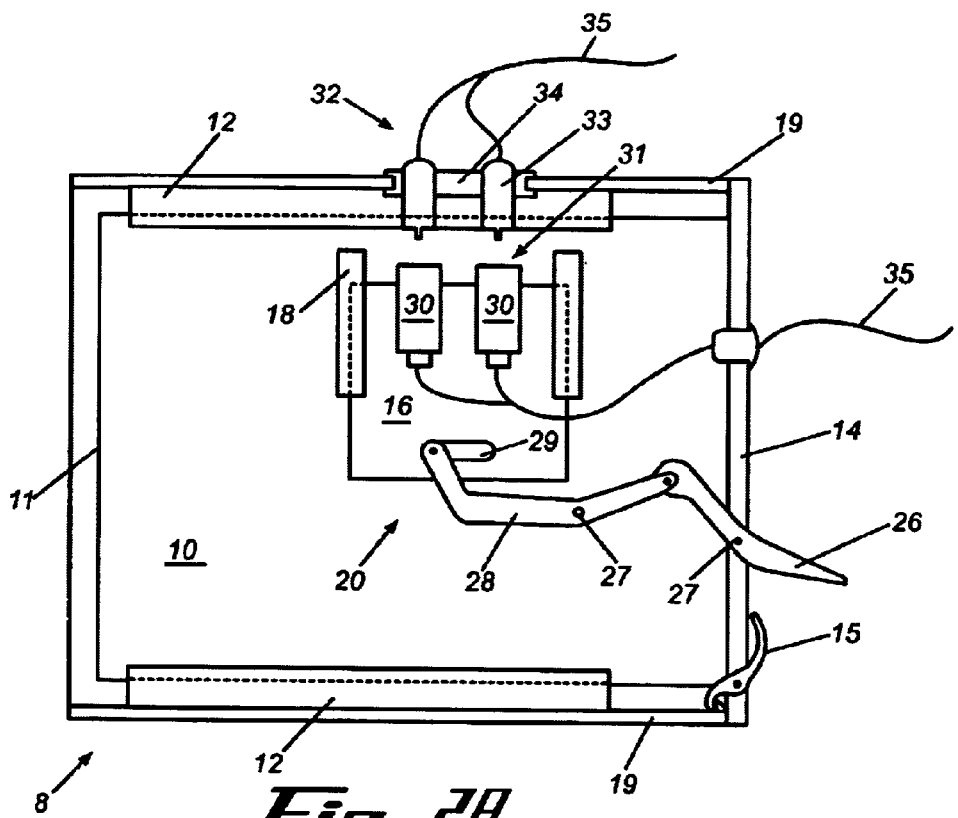
FIGS. 2A and 2B are side views of various stages in the process of connecting the optical devices and optical connectors, similar to those revealed in FIG. 1B, in an embodiment of the present invention.
Figure 2B:
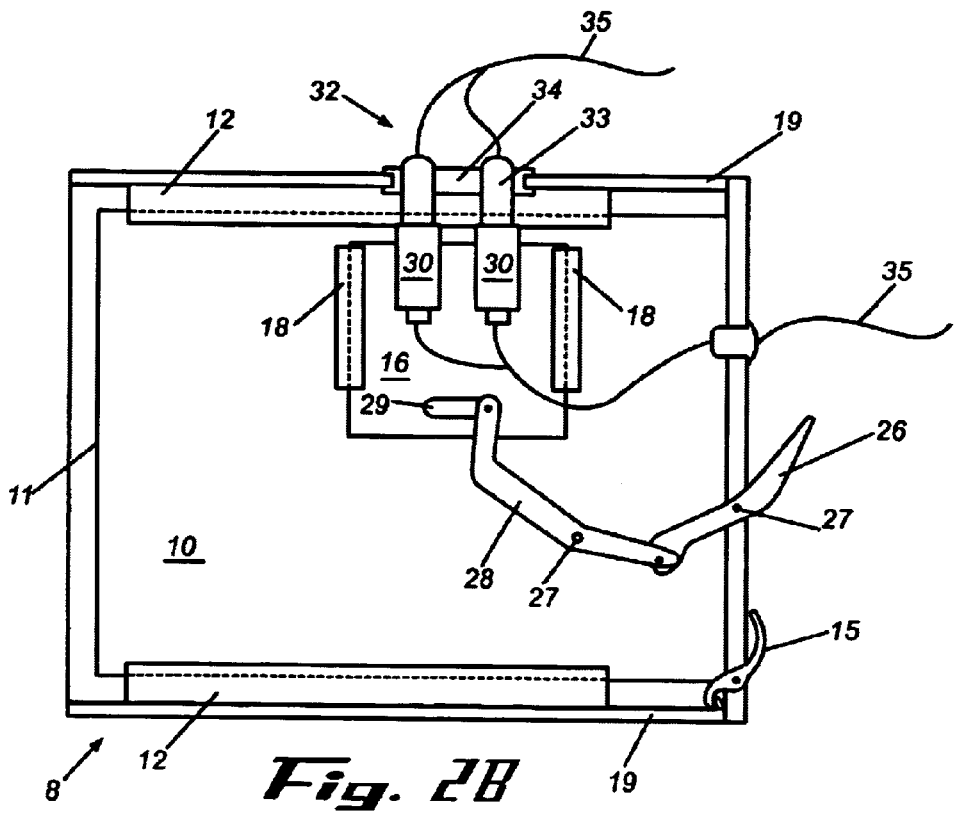

As shown in FIGS. 2A and 2B, the present invention permits the optical plugs 33 to be slidably engaged with the jack receptacles 31 of the optical devices 30 subsequent to the installation of an optical circuit board 10 in an optical circuit pack assembly 8. Again, because optical plugs 33 and optical devices 30 are no longer visible to the individual installing the optical circuit board 10 at this point, this operation as referred to as "blind-mating." In the preferred embodiment of FIG. 2A, the optical circuit board 10 includes a faceplate 14, a faceplate latch 15, a child board 16, child board card guides 18, optical devices 30, and a cam-action optical connector mechanism 20. The optical connectors 32 are firmly secured to the child board 16 and the child board 16 is in turn slidably secured to the optical circuit board 10 by the child board card guides 18. The child board card guides 18 restrict the child board 16 to a single axis of travel. The optical plugs 33 interlock with the optical connector joining assemblies 34.

The optical circuit board 10 is typically contained in an optical circuit pack assembly 8 and is mounted on a shelf using optical circuit board guides 12. The optical circuit pack assembly 8 is plugged into the shelf and is typically held in place with a latch 15 on its faceplate 14, the faceplate 14 being mounted to a side edge of the optical circuit board 10 that is opposite the leading edge 11 of the optical circuit board 10. The faceplate latch 15 is designed to overcome the cumulative spring forces of any optical connectors 32 on the backplane 47 (not shown).

As well, the cam-action optical connector mechanism 20 includes a first member 26 passing through the faceplate 14. One end of the first member 26 is exposed through the faceplate 14 while the other end is rotatably secured to one end of the second member 28, the opposing end of the second member 28 slidably engaging an aperture 29 formed in the child board 16. Both the first member 26 and second member 28 rotate about fixed posts 27. So configured, activation of the first member 26 from the faceplate 14 causes the child board 16 to be urged along its axis of travel.

Figure 4A:
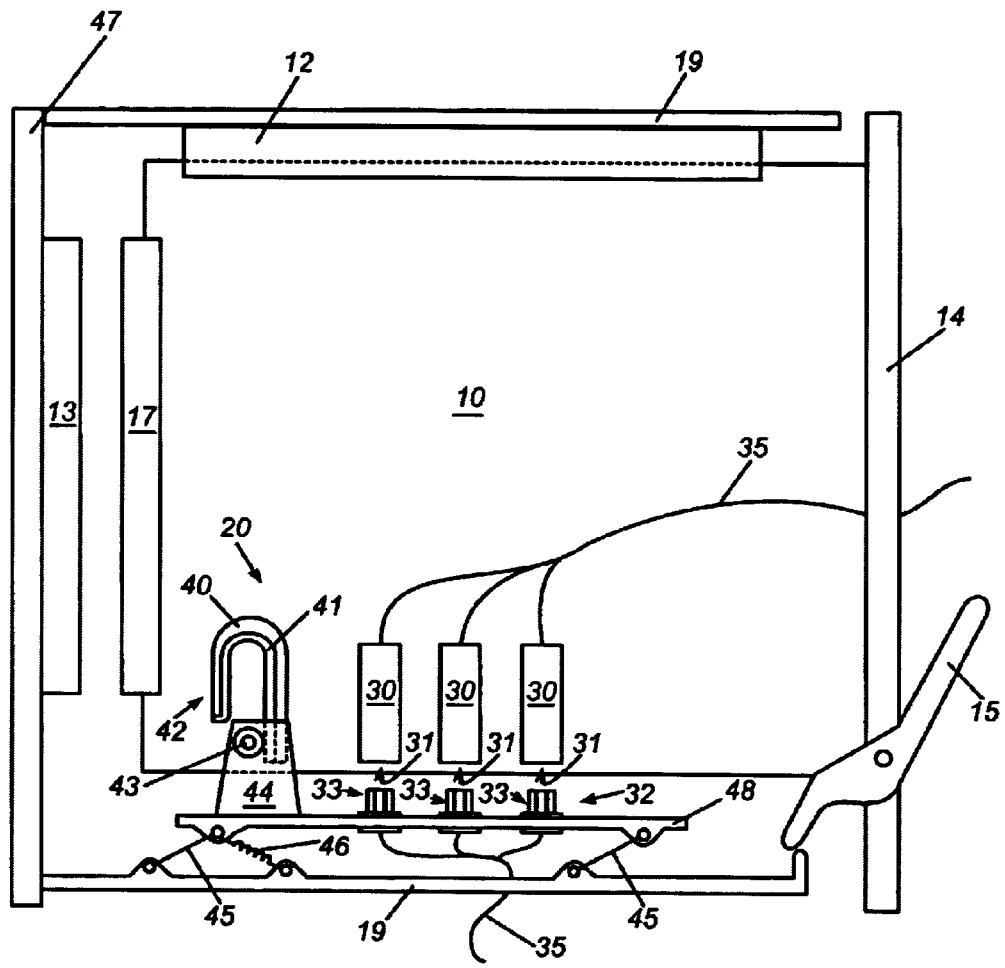
FIGS. 4A and 4B are side views of various stages in the process of connecting the optical devices and optical connectors, similar to those revealed in FIG. 1B, in an embodiment of the present invention.
Figure 4B:
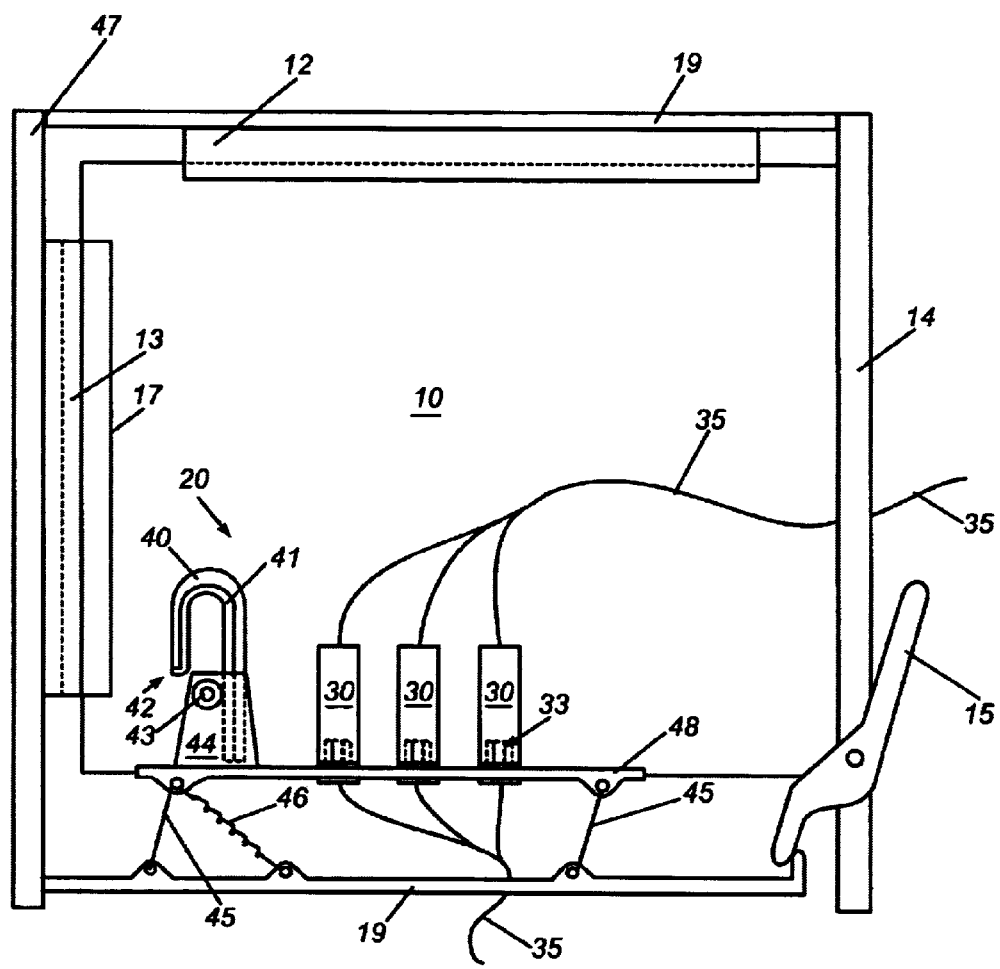

Also shown in FIG. 2A is the optical circuit pack assembly 8, which includes fixed panels 19 (or midplanes), optical circuit board guides 12, optical connectors 32, and quite often a backplane 47 (FIGS. 4A and 4B). The optical connectors 32 further include optical connector joining assemblies 34 and optical plugs 33 configured to slidably engage but not connect with jack receptacles 31 of the optical devices 30. The cam-action optical connector mechanism 20 of a preferred embodiment of the present invention may be used for the blind-mating of optical plugs 33 and jack receptacles 31, thereby connecting the optical devices 30 to the associated optical fibers 35. The operation of the cam-action optical connector mechanism 20 will now be discussed.

OPERATION

Optical circuit board 10 is inserted into the optical circuit pack assembly 8. Proper alignment of the optical circuit board 10 in the optical circuit pack assembly 8 is ensured by the optical circuit board guides 12 which engage the side edges of the optical circuit board 10. Quite often (but not shown here), an optical circuit pack assembly 8 will include a backplane 47, where blind-mating of optical connectors 32 may take place. The optical circuit board guides 12 ensure proper alignment for the connections on the backplane 47. The faceplate latch 15 secures the optical circuit board 10 in the desired position, overcoming any spring-like forces due to connections on the backplane 47. However, in the present invention, the blind-mating is to occur with optical connectors 32 disposed in the fixed panels 19, vice the backplane 47.

After the optical circuit board 10 has been inserted in the optical circuit pack assembly 8, operation of the cam-action optical connector mechanism 20 ensures optical plugs 33 properly engage the jack receptacles 31. As seen in FIG. 2B, by rotating the first member 26 about a fixed post 27, the second member 28 subsequently rotates about its fixed post 27. A number of factors determine the proper positions for fixed posts 27, such as the lengths of the first member 26 and second member 28, and the required distance the child board 16 must travel to ensure proper engagement of the optical plugs 33 and jack receptacles 31. As the second member 28 rotates about its fixed post 27, the rotary motion of the end of the second member 28 engaging the aperture 29 in the child board 16 is translated into linear motion of the child board 16, as dictated by the child board card guides 18. Subsequently, as the child board 16 is urged along its axis of travel, the optical devices 30 attached thereto will be similarly urged, causing the jack receptacles 31 to engage the optical plugs 33. As well, operation of the first member 26 in the direction opposite that used for engagement will set in motion a similar but opposite chain of events resulting in the jack receptacles 31 and optical plugs 33 becoming disengaged, thereby facilitating removal of the optical circuit board 10 from the optical circuit pack assembly 8.

Figure 3A:
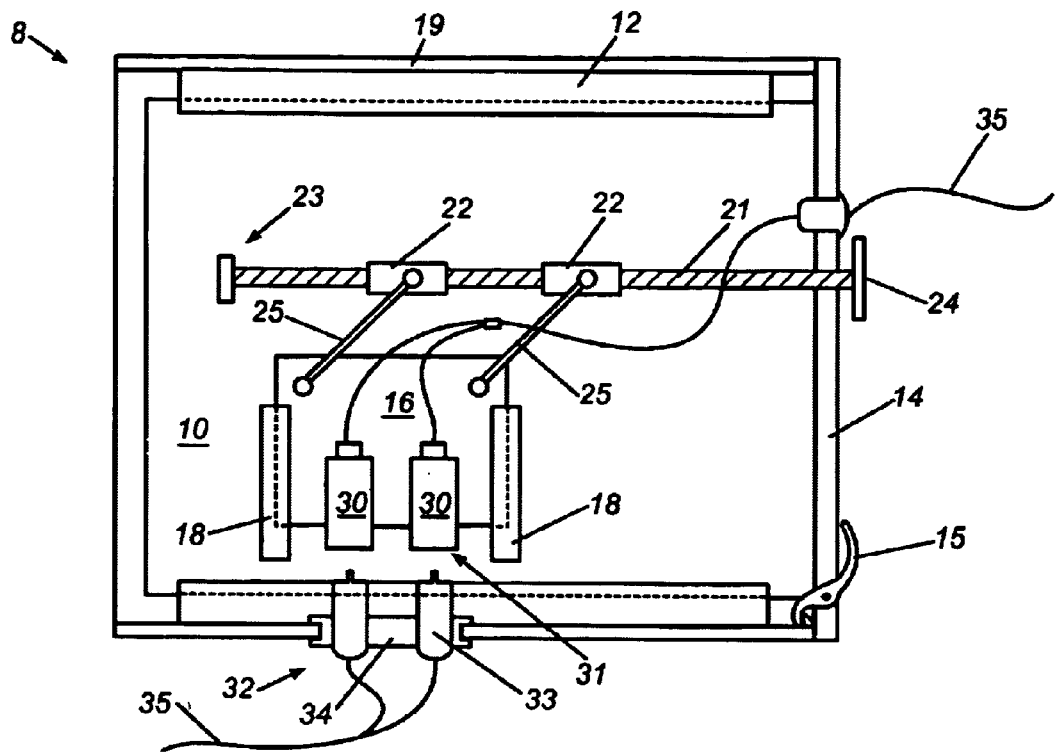
FIGS. 3A and 3B are side views of various stages in the process of connecting the optical devices and optical connectors, similar to those revealed in FIG. 1B, in an embodiment of the present invention.
Figure 3B:
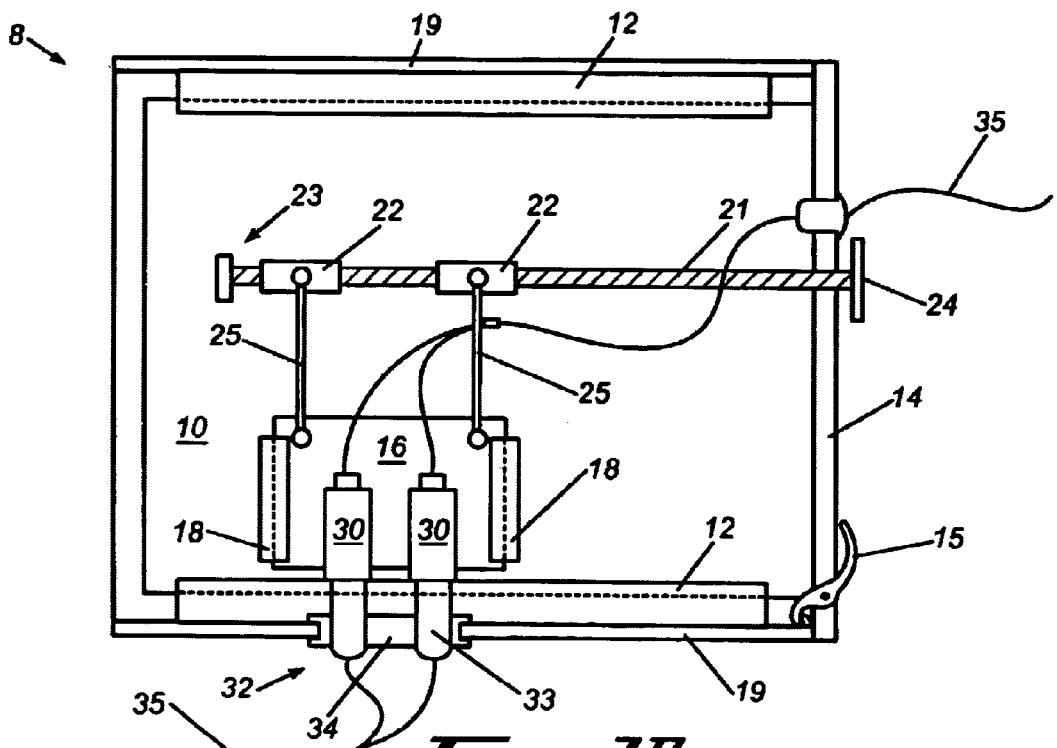

Another preferred embodiment of the present invention is shown in FIGS. 3A and 3B that similarly allows for the blind-mating of optical plugs 33 secured to a fixed panel 19 with the jack receptacles 31 of the optical devices 30 that are secured to the child board 16. The optical circuit board 10 and optical circuit pack assembly 8 revealed here both include the same elements and are similarly configured to the optical circuit board 10 and optical circuit pack assembly 8 of FIGS. 2A and 2B, with one exception. The cam-action optical connector mechanism 20 of FIG. 3A includes a screw mechanism 21 and associated carrier mechanism 22. The screw mechanism 21 has a restrained end 23 and an end that extends through the face plate 1, having a rotary mechanism 24 to allow operation of the screw mechanism 21 subsequent to optical circuit board 10 installation in the optical circuit pack assembly 8. The restrained end 23 is secured to the optical circuit board 10 such that rotation about the screw mechanism's 21 longitudinal axis is possible. One or more carrier mechanisms 22 are disposed on the screw mechanism 21 such that rotation of the screw mechanism 21 causes the carrier mechanism 22 to travel along the screw mechanism 21. As well, each carrier mechanism 22 is connected to the child board 16 by a strut 25. Each strut 25 is rotatably secured to a carrier mechanism 22 at one end and rotatably secured to the child board 16 at the other.

After the optical circuit board 10 has been installed in the optical circuit pack assembly 8, operation of the cam-action optical connector mechanism 20 ensures the jack receptacles 31 of the optical devices 30 and the optical plugs 33 properly engage. As before, the optical circuit board guides 12 ensure proper alignment of the optical circuit board 10 within the optical circuit pack assembly 8, and the face plate latch 15 ensures the optical circuit board 10 remains in proper position. Manipulation of the rotary device 24 causes rotary motion of the screw mechanism 21, which in turn causes linear motion of the carrier mechanisms 22 along the longitudinal axis of the screw mechanism 21. The direction of motion of the carrier mechanisms 22 will depend on the direction of rotation of the rotary device 24 and whether or not a left or right hand thread is utilized on the screw mechanism 21.

As the carrier mechanisms 22 travel toward the restrained end 23 of the screw mechanism 21, the linear motion of the carrier mechanisms 22 is translated to linear motion of the child board 16 via the struts 25. As the child board 16 moves along the axis of travel dictated by the child board card guides 18, the optical devices 30 are similarly urged, thereby causing the jack receptacles 31 to engage the optical plugs 33. As well, rotation of the rotary device 24 in the direction opposite that used for engagement will set in motion a similar but opposite chain of events resulting in the jack receptacles 31 and optical plugs 33 becoming disengaged, thereby facilitating removal of the optical circuit board 10 from the optical circuit pack assembly 8.

Another preferred embodiment of the present invention is shown in FIG. 4A, where the optical circuit board 10 has not yet been installed in the optical circuit pack assembly 8. The optical circuit board 10 includes a faceplate 14, a faceplate latch 15, optical devices 30, a plug-in connector 17, and a cam/roller guide assembly 40. The optical devices 30 are secured directly to the optical circuit board 10 as is the cam/roller guide assembly 40. The cam/roller guide assembly 40 also includes a roller surface 41. The optical circuit pack assembly 8 includes fixed panels 19, optical circuit board guides 12 (the lower guide 12 has been left off for clarity), a backplane 47, a backplane pin connector 13, and an optical connector support board 48. Note, unlike the prior embodiments, a backplane 47 is shown. The backplane 47 is not necessary to the present invention and is only shown to reveal how the present invention may be used in concert with backplane connections. The optical connector support board 48 is attached to a fixed panel 19 by rotary struts 45. Each rotary strut 45 is attached at one end to the optical connector support board 48 and at the other end to a fixed panel 19. A return spring 46 is connected at one end to the optical connector support board 48 and at the other end to the fixed panel 19 the rotary struts 45 are attached to. The return spring 46 is configured to resist the motion of the optical connector support board 48 during insertion of the optical circuit board 10 into the optical circuit pack assembly 8. The optical connector support board 48 further includes optical plugs 33 secured thereto by optical connector joining assemblies 34 and a roller support 44 for the roller/follower 43.

FIG. 4A reveals the optical circuit board 10 at a moment during installation when the roller/follower 43 has made contact with the roller surface 41 of the cam/roller guide assembly 40. As the optical circuit board 10 is inserted into the optical circuit pack assembly 8, the optical circuit board guides 12 will ensure the alignment necessary for the blind-mating of the backplane pin connector 13 with the plug-in connector 17, as well as the optical plugs 33 with the jack receptacles 31. As the optical circuit board 10 is urged along the optical circuit board guides 12, the roller/follower 43 moves upwardly along the roller surface 41. This causes the optical connector support board 48 to follow an arc as defined by the motion of the rotary struts 45 about their ends that are attached to the fixed panel 19. Eventually, as the optical connector support board 48 rotates upwardly, the optical plugs 33 will engage the jack receptacles 31 of the optical devices 30. Note that unlike the previous embodiments, in the instant case, the optical plug 33 is the movable optical connector 32 rather than the jack receptacle 31.

The optical circuit board 10 as finally installed is shown in FIG. 4B. Note that it is necessary to choose various dimensions and placements such that the backplane connections and midplane connections are operably correct once the optical circuit board 10 has been secured in its final position by the faceplate latch 15. The faceplate latch 15 overcomes any residual spring force from the backplane pin connector 13 and plug in connector that could cause the optical circuit board 10 to "back out" of the optical circuit pack assembly 8. To remove the optical circuit board 10, the faceplate latch 15 is first disengaged, then the optical circuit board 10 is slid out of the optical circuit pack assembly 8. Note that as the optical circuit board 10 is initially removed, a disengagement hook 42 engages the roller/follower 43. The disengagement hook 42 insures a positive, initial disengagement of the optical plugs 33 from the jack receptacles 31. As the optical circuit board 10 is further slid out of the optical circuit pack assembly 8, the cam/roller guide assembly 40 no longer exerts force on the roller/follower 43, and the return spring 46 exerts a force that subsequently causes the roller/follower 43 to travel down the roller surface. The optical circuit board 10 is therefore pulled by the return spring 46 in a downward arc, allowing the optical plugs 33 to fully disengage the jack receptacles 31 as the optical circuit board 10 is removed from the optical circuit pack assembly 8.

It should be emphasized that the above-described embodiments of the present invention, particularly, any preferred embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A interconnection system for optical transmission media, comprising:
   an optical circuit pack assembly;
   an optical circuit board adapted for insertion into a slot of said optical circuit pack assembly, said slot being configured to receive said optical circuit board in a first direction;
   a child board movably mounted on said optical circuit board;
   at least one optical device mounted on said child board;
   at least one optical connector mounted on a fixed panel;
   an optical connector mechanism operationally connected to said child board, the optical connector mechanism being a cam-action optical connector mechanism attached on a first end of said mechanism to the child board and having a second end freely disposed outside of said optical circuit pack assembly; and
   wherein when a force is exerted on the second end of said mechanism in a direction away from said child board, said child board is urged along an axis of travel that is at least substantially transverse to said first direction and parallel to a longitudinal axis of said optical device, wherein when said child board is urged along said axis of travel, said at least one optical device is interconnected with said at least one optical connector.

2. The interconnection system of claim 1, wherein said fixed panel is a portion of said optical circuit pack assembly.

3. The interconnection system of claim 1, wherein said at least one optical device comprises a front end and a back end, said front end having at least one jack receptacle configured to receive at least one optical plug, said at least one optical plug comprising said optical connector.

4. The interconnection system of claim 3, wherein said at least one optical device includes active devices and passive devices.

5. The interconnection system of claim 3, wherein said at least one optical plug and said at least one jack receptacle are adapted to engage each other when said at least one optical device and said at least one optical connector are interconnected.

6. The interconnection system of claim 3, wherein said at least one optical plug and said at least one jack receptacle are adapted to engage, but not interlock with, each other when said at least one optical device and said at least one optical connector are interconnected.

7. The interconnection system of claim 1, wherein said child board is slidably attached to said optical circuit board by card guides, said card guides including opposed members having channels formed therein for engaging said child board.

8. The interconnection system of claim 1, wherein said cam-action optical connector mechanism translates rotary motion of said cam-action connector mechanism into linear motion of said child board.

9. The interconnection system of claim 8, wherein said cam-action device further comprises:
   a screw mechanism having a rider mechanism disposed thereon such that rotary motion of said screw mechanism causes said rider mechanism to travel along a longitudinal axis of said screw mechanism, said longitudinal axis of said screw mechanism being parallel to a longitudinal axis of said optical circuit board; and
   a connector member rotatably attached to said rider mechanism and operably connected to said optical device, such that as said rider mechanism travels along said screw mechanism, said optical device is urged along said axis of travel.

10. The interconnection system of claim 9, wherein said at least one optical device is rigidly attached to said child board, said child board being slidably attached to said optical circuit board, and wherein said connector member is rotatably attached to said child board.

11. The interconnection system of claim 9, wherein said screw mechanism is operated from a faceplate of said optical circuit board.

12. The interconnection system of claim 8, wherein said cam-action device further comprises a first member and a second member, said first member having a first end, a fixed pivot point, and a second end being pivotally connected to said second member, said second member having a first end pivotally connected to said second end of said first member, a fixed pivot point, and a second end operably connected to said child board such that rotation of said first member about said fixed pivot point causes said second member to rotate about said fixed pivot point, thereby urging said child board along said axis of travel.

13. The interconnection system of claim 10, wherein said cam-action device is operated from a faceplate of said optical circuit board.

14. An interconnection system for optical transmission media, comprising:
   an optical circuit board adapted for insertion into a slot, said slot being mounted in a structure and configured to receive said optical circuit board in a first direction, said structure including a fixed panel;
   an optical device mounted on said optical circuit board;
   a cam/roller guide assembly disposed on said optical circuit board;
   an optical connector support board movably connected to said fixed panel, and configured for mounting a roller/follower and an optical connector;
   a roller/follower mounted on said optical connector support board and configured to engage said cam/roller guide assembly;
   an optical connector mounted on said optical connector support board; and
   wherein during the insertion of said optical circuit board into said slot, said roller/follower engages said cam/roller guide assembly such that said optical connector and said optical device are operably engaged.

15. The interconnection system of claim 14, wherein said optical device further comprises a front end and a back end, said front end having a jack receptacle, said optical connector further comprises an optical plug, and said jack receptacle and said optical plug are adapted to operably engage, but not interlock, with each other.

16. The interconnection system of claim 14, wherein said optical connector support board is connected to said fixed panel by a first and a second member, said first and second members each having a proximal end rotatably attached to said fixed panel and a distal end rotatably attached to said optical connector support board such that when said optical circuit board is inserted into said slot and said cam/roller guide assembly engages said roller/follower, said optical connector support board is urged along an arc such that said optical plug slidably engages said jack receptacle of said optical device.

17. The interconnection system of claim 14, further comprising a return spring having a first end and a second end, said first end being attached to said fixed panel and said second end being attached to said optical connector support board, said return spring configured to exert a force that opposes the force applied to said optical connector support board during installation of said optical circuit board.

18. The interconnection system of claim 14, wherein said structure is an optical circuit pack assembly.

19. A method for interconnecting optical transmission media, comprising the steps of:
  mounting at least one optical connector to a fixed panel;
  movably attaching a child board on an optical circuit board;
  mounting at least one optical device on said child board;
  operationally connecting an optical connector mechanism to said child board, the optical connector mechanism being a cam-action optical connector mechanism attached on a first end of said mechanism to the child board and having a second end freely disposed outside of said optical circuit pack assembly;
  slidably inserting said optical circuit board into a slot of an optical circuit pack assembly configured to receive said optical circuit board in a first direction; and
  exerting a force on the second end of said mechanism in a direction away from said child board to cause said child board to be urged along an axis of travel that is substantially transverse to said first direction and parallel to a longitudinal axis of said optical device, wherein when said child board is urged along said axis of travel, said at least one optical connector and said at least one optical device are operably connected.

20. The method as claimed in claim 19, wherein said movably attaching step further includes slidably attaching said child board to said optical circuit board, and wherein the step of mounting at least one optical device includes the step of rigidly securing said at least one optical device to said child board, said child board being a substrate.

21. A method for interconnecting optical transmission media, comprising the steps of:
  mounting an optical device and an cam/roller guide assembly on an optical circuit board adapted for insertion into a slot;
  mounting an optical connector and a roller/follower to an optical connector support board;
  movably connecting said optical connector support board to a fixed panel; and
  inserting said optical circuit board into said slot such that said roller/follower engages said cam/roller guide assembly such that said optical device and optical connector are operably engaged.

* * * * *